US010218326B2

(12) United States Patent
Chen et al.

(10) Patent No.: US 10,218,326 B2
(45) Date of Patent: Feb. 26, 2019

(54) SOURCE FOLLOWER BASED ENVELOPE TRACKING FOR POWER AMPLIFIER BIASING

(71) Applicant: QUALCOMM Incorporated, San Diego, CA (US)

(72) Inventors: Jiang Chen, San Diego, CA (US); Jeremy Goldblatt, Encinitas, CA (US); Jose Cabanillas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/583,890

(22) Filed: May 1, 2017

(65) Prior Publication Data

US 2018/0123538 A1    May 3, 2018

Related U.S. Application Data (60) Provisional application No. 62/414,278, filed on Oct. 28, 2016.

(51) Int. Cl.
*H03G 3/00* (2006.01)
*H03G 3/30* (2006.01)
(Continued)

(52) U.S. Cl.
CPC ......... *H03G 3/3042* (2013.01); *H03F 1/0266* (2013.01); *H03F 1/223* (2013.01); *H03F 1/32* (2013.01); *H03F 1/56* (2013.01); *H03F 3/189* (2013.01); *H03F 3/193* (2013.01); *H03F 3/21* (2013.01); *H03F 3/245* (2013.01); *H03F 3/45179* (2013.01); *H03F 3/505* (2013.01); *H03F 2200/102* (2013.01); *H03F 2200/211* (2013.01); *H03F 2200/222* (2013.01);
(Continued)

(58) Field of Classification Search
CPC .......... H03G 3/3042; H03F 1/56; H03F 3/21; H03F 3/193
USPC ......................... 330/136, 127, 296, 284, 252
See application file for complete search history.

(56) References Cited

U.S. PATENT DOCUMENTS 6,025,754 A    2/2000  Czora
9,148,097 B2   9/2015  Ding et al.
(Continued)

OTHER PUBLICATIONS

International Search Report and Written Opinion—PCT/US2017/053827—ISA/EPO—dated Dec. 19, 2017.

*Primary Examiner* — Khanh V Nguyen
*Assistant Examiner* — Khiem Nguyen
(74) *Attorney, Agent, or Firm* — Qualcomm Incorporated/Seyfarth Shaw LLP (57) ABSTRACT

A power amplifier bias circuit with embedded envelope detection includes a bias circuit stage coupled to an envelope detector circuit to increases a bias provided to a power amplifier as a function of an incoming envelope signal. The envelope detector circuit includes a first source/emitter follower transistor, a current source, and a filter to generate a baseband envelope signal. The current source is coupled to an output node of the first source/emitter follower transistor and the filter is also coupled to the output node of the first source/emitter follower transistor. The bias circuit stage includes one or more replica transistors that replicate transistors of the power amplifier or power amplifier core stage, an envelope detector replica transistor and a replica of the current source of the envelope detector circuit.

21 Claims, 9 Drawing Sheets

(51) Int. Cl.

| | |
|---|---|
| *H03F 1/56* | (2006.01) |
| *H03F 3/193* | (2006.01) |
| *H03F 3/21* | (2006.01) |
| *H03F 1/02* | (2006.01) |
| *H03F 1/32* | (2006.01) |
| *H03F 3/189* | (2006.01) |
| *H03F 1/22* | (2006.01) |
| *H03F 3/24* | (2006.01) |
| *H03F 3/45* | (2006.01) |
| *H03F 3/50* | (2006.01) |

(52) U.S. Cl.
CPC .. *H03F 2200/318* (2013.01); *H03F 2200/387* (2013.01); *H03F 2200/411* (2013.01); *H03F 2200/537* (2013.01); *H03F 2200/69* (2013.01); *H03F 2203/45394* (2013.01); *H03G 2201/106* (2013.01)

(56) References Cited

U.S. PATENT DOCUMENTS

| | | |
|---|---|---|
| 9,379,668 B1 | 6/2016 | Lerdworatawee et al. |
| 9,385,665 B2 | 7/2016 | Toivonen et al. |
| 2008/0136526 A1 | 6/2008 | Behzad et al. |
| 2008/0204146 A1* | 8/2008 | Bouny .................. H03F 1/0288 330/295 |
| 2009/0015328 A1 | 1/2009 | Aoki et al. |
| 2012/0007580 A1 | 1/2012 | Kim |
| 2015/0214908 A1 | 7/2015 | Kim et al. |
| 2016/0013804 A1 | 1/2016 | Peluso et al. |
| 2016/0094184 A1 | 3/2016 | Ripley |
| 2016/0241199 A1 | 8/2016 | Nobbe et al. |

* cited by examiner

SOURCE FOLLOWER BASED ENVELOPE TRACKING FOR POWER AMPLIFIER BIASING

CROSS-REFERENCE TO RELATED APPLICATION

The present application claims the benefit of U.S. Provisional Patent Application No. 62/414,278, filed on Oct. 28, 2016, and titled "SOURCE FOLLOWER BASED ENVELOPE TRACKING FOR POWER AMPLIFIER BIASING," the disclosure of which is expressly incorporated by reference herein in its entirety.

TECHNICAL FIELD

The present disclosure generally relates to power amplifiers. More specifically, the present disclosure relates to power amplifier bias circuits with embedded envelope detection to provide envelope tracking bias.

BACKGROUND

Electronic amplifiers are used for increasing a power and/or an amplitude of various electronic signals. Most electronic amplifiers operate by using power from a power supply, and controlling an output signal to match the shape of an input signal, while providing a higher amplitude signal.

One widely used type of electronic amplifier is a power amplifier, which is a versatile device used in various applications to meet design specifications for signal conditioning, special transfer functions, analog instrumentation, and analog computation, among others. Power amplifiers are often used in wireless applications, and may employ radio-frequency (RF) amplifier designs for use in the RF range of the electromagnetic spectrum. An RF power amplifier is a type of electronic amplifier used to convert a low-power RF signal into a signal of significant power, such as for driving an antenna of a transmitter, for example. RF power amplifiers are also used to increase the range of a wireless communication system by increasing the output power of a transmitter.

Power amplifier properties of linear operation and efficiency may be inversely proportional to one another. It is desirable to power amplifier efficiency, while reducing non-linear operation. One approach for improving efficiency of the power amplifiers is through envelope tracking (ET). Power supply envelope tracking circuitry, however, increases the cost of a mobile device. Thus, some lower cost mobile devices do not have this feature.

SUMMARY

In an aspect of the present disclosure, a power amplifier bias circuit with embedded envelope detection is presented. The power amplifier bias circuit includes an envelope detector circuit to generate a baseband envelope tracking bias signal to bias a power amplifier. The envelope detector circuit includes a first source/emitter follower transistor, a current source, and a filter. The current source is coupled to an output node of the first source/emitter follower transistor. The filter is coupled to the output node of the first source/emitter follower transistor. The power amplifier bias circuit with embedded envelope detection further includes a power amplifier bias circuit stage coupled to the envelope detector circuit. The power amplifier bias circuit stage includes one or more replica transistors of the power amplifier, an envelope detector replica transistor, and a replica of the current source of the envelope detector circuit.

In another aspect of the present disclosure, a power amplifier bias circuit with embedded envelope detection is presented. The power amplifier bias circuit with embedded envelope detection includes an envelope detector circuit to generate a baseband envelope tracking bias signal to bias a power amplifier. The envelope detector circuit includes a first source/emitter follower transistor, means for generating current to an output node of the first source/emitter follower transistor, and means for filtering radio frequency signals at the output node of the first source/emitter follower transistor. The power amplifier bias circuit with embedded envelope detection further includes a power amplifier bias circuit stage coupled to the envelope detector circuit. The power amplifier bias circuit stage includes one or more replica transistors of the power amplifier, an envelope detector replica transistor, and a replica of the current generating means of the envelope detector circuit.

In yet another aspect of the present disclosure, a method of biasing a power amplifier core stage of a power amplification device is presented. The method includes adjusting a gain of a sensed radio frequency signal. The method also includes generating an envelope tracking bias signal obtained at an output node of a source/emitter follower based envelope detector circuit. The envelope tracking bias signal is based on the sensed radio frequency signal that is adjusted and a bias signal from a power amplifier bias circuit stage. The method further includes transmitting the envelope tracking bias signal to a power amplifier when the sensed radio frequency signal is applied to the source/emitter follower based envelope detector circuit.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A wireless device, such as a user equipment (UE), may include transmit chains that are composed of multiple radio frequency transmitters, multiple power amplifiers, multiple antennas and one or more front end (FE) devices through which signals are transmitted from the UE. The transmit chains of the UE, however, may include a class of power amplifiers that are designed for meeting a power level specified for a current device generation.

The power amplifier (e.g., a radio frequency power amplifier) or power amplification device may suffer from gain compression when operating close to a maximum or increased power. Gain compression occurs when the input power of the power amplifier is increased to a level that reduces the gain of the power amplifier and causes a nonlinear increase in output power. As the input power increases, the amplifier gain appears to decrease, and the amplifier goes into compression. One way to mitigate gain compression is with an envelope tracking implementation. Envelope tracking bias (ET bias) is a technique that provides dynamic bias to the power amplifier according to the radio frequency signal envelope amplitude. With envelope tracking, the radio signal from a power supply voltage applied to the power amplifier through an envelope tracking stage is continuously adjusted to ensure that the amplifier is operating at peak efficiency for power specified at each instance of transmission.

The envelope tracking implementation reduces the gain compression at a high power range while maintaining efficiency at a low power range. Conventional solutions for generating envelope tracking bias introduce unwanted distortions and imbalance and load the signal path to the power amplifier. The purpose of the envelope tracking implementation is to generate and feed an envelope dependent bias to the power amplifier. Any harmonic, distortion, or differential imbalance associated with the envelope tracking implementation degrades the efficiency of the power amplifier and is considered "unwanted."

Various exemplary designs of an amplifier module (e.g., a power amplifier module or power amplification device) with multiple operating modes and having improved performance are described. For example, aspects of the present disclosure are directed to a power amplifier bias circuit with embedded envelope detection that includes a bias circuit stage coupled to the envelope detector circuit. Because envelope detection or envelope tracking may be defined as holding the peaks of an RF signal, the power amplifier bias circuit with embedded envelope detection may be referred to as an envelope tracking bias.

The envelope detector circuit includes a first source follower transistor, a current source, and a filter to generate a baseband envelope signal. The current source is coupled to an output node of the first source follower transistor and the filter is also coupled to the output node of the first source follower transistor. The bias circuit includes one or more replica transistors that replicate transistors of a power amplifier or power amplifier core stage, an envelope detector replica transistor and a replica of the current source of the envelope detector circuit.

Although aspects of the present disclosure including implementation of the power amplifier bias circuit with embedded envelope detection are described using transistors such as metal oxide semiconductor field effect transistors (MOSFETs), the aspects of the present disclosure can also be implemented with other transistors such as bipolar junction transistors (BJTs) or in combination with bipolar junction transistors. Different signals (e.g., radio frequency, bias and control signals) may be received or transmitted through different terminals of the different types of transistors. For example, when the transistors are MOSFETs the signals may be received or transmitted through a drain, a gate or a source of the MOSFETs. When the transistors are BJTs the signals may be received or transmitted through a collector, a base or an emitter of the BJTs.

The envelope tracking bias implementation (akin to analog pre-distortion) increases the bias provided to the power amplifier as a function of an incoming envelope signal, thereby effectively changing a signal dependent gain characteristic to approximate a more constant gain over a greater range of power amplification.

The power amplification device may be used in various electronic devices such as wireless communication devices, cellular phones, personal digital assistants (PDAs), handheld devices, wireless modems, laptop computers, cordless phones, Bluetooth devices, consumer electronic devices, etc. For clarity, the use of the power amplification device in a wireless communication device is described.

Figure 1:
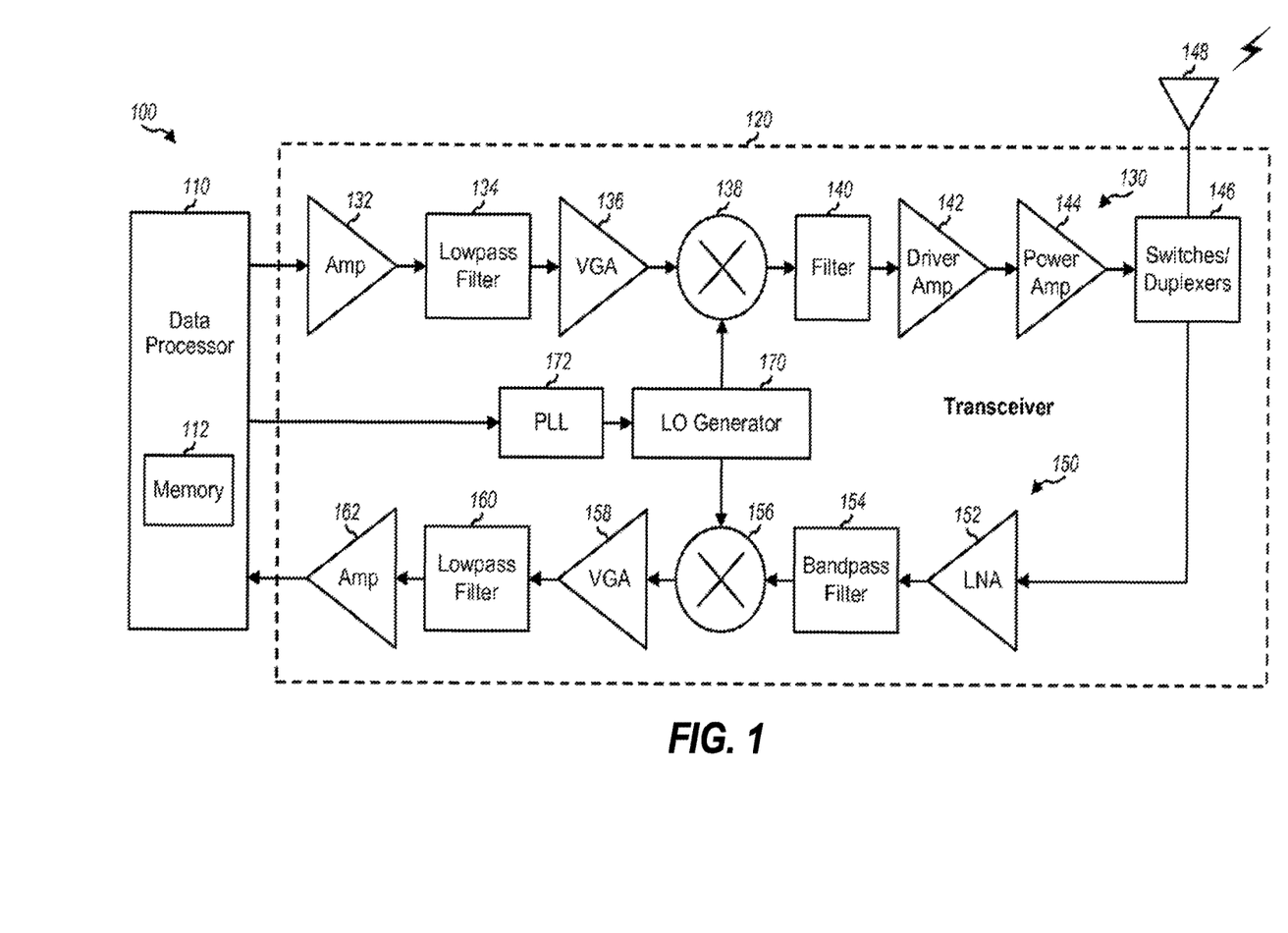
FIG. 1 shows a block diagram of a wireless communication device.

FIG. 1 shows a block diagram of an exemplary design of a wireless communication device or wireless device 100. In this exemplary design, the wireless device 100 includes a data processor 110 and a transceiver 120. The transceiver 120 includes a transmitter 130 and a receiver 150 that support bi-directional wireless communication. In general, the wireless device 100 may include any number of transmitters and any number of receivers for any number of communication systems and any number of frequency bands.

In the transmit path, the data processor 110 processes data to be transmitted and provides an analog output signal to the transmitter 130. Within the transmitter 130, the analog output signal is amplified by an amplifier (Amp) 132, filtered by a low pass filter 134 to remove images caused by digital-to-analog conversion, amplified by a VGA 136, and upconverted from baseband to radio frequency (RF) by a mixer 138. The upconverted signal is filtered by a filter 140, further amplified by a driver amplifier 142 and a power amplifier 144, routed through switches/duplexers 146, and transmitted via an antenna 148.

In the receive path, the antenna 148 receives signals from base stations and/or other transmitter stations and provides a received signal, which is routed through the switches/duplexers 146 and provided to the receiver 150. Within the receiver 150, the received signal is amplified by a low noise amplifier (LNA) 152, filtered by a bandpass filter 154, and downconverted from radio frequency to baseband by a mixer 156. The downconverted signal is amplified by a VGA 158, filtered by a low pass filter 160, and amplified by an amplifier 162 to obtain an analog input signal, which is provided to the data processor 110.

FIG. 1 shows the transmitter 130 and the receiver 150 implementing a direct-conversion architecture, which frequency converts a signal between radio frequency and baseband in one stage. The transmitter 130 and/or the receiver 150 may also implement a super-heterodyne architecture, which frequency converts a signal between radio frequency and baseband in multiple stages. A local oscillator (LO) generator 170 generates and provides transmit and receive LO signals to the mixers 138 and 156, respectively. A phase locked loop (PLL) 172 receives control information from the data processor 110 and provides control signals to the LO generator 170 to generate the transmit and receive LO signals at the proper frequencies.

FIG. 1 shows an exemplary transceiver design. In general, the conditioning of the signals in the transmitter 130 and the receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and the receiver. For example, matching circuits may be used to match various active circuits in FIG. 1. Some circuits in FIG. 1 may also be omitted. The transceiver 120 may be implemented on one or more analog integrated circuits (ICs), radio frequency ICs (RFICs), mixed-signal ICs, etc. For example, the amplifier 132 through the power amplifier 144 in the transmitter 130 may be implemented on an RFIC. The driver amplifier 142 and the power amplifier 144 may also be implemented on another IC external to the RFIC.

The data processor 110 may perform various functions for the wireless device 100, e.g., processing for transmitted and received data. A memory 112 may store program codes and data for the data processor 110. The data processor 110 may be implemented on one or more application specific integrated circuits (ASICs) and/or other ICs.

As shown in FIG. 1, a transmitter and a receiver may include various amplifiers. Each amplifier at radio frequency may have input impedance matching and output impedance matching, which are not shown in FIG. 1 for simplicity.

Figure 2:
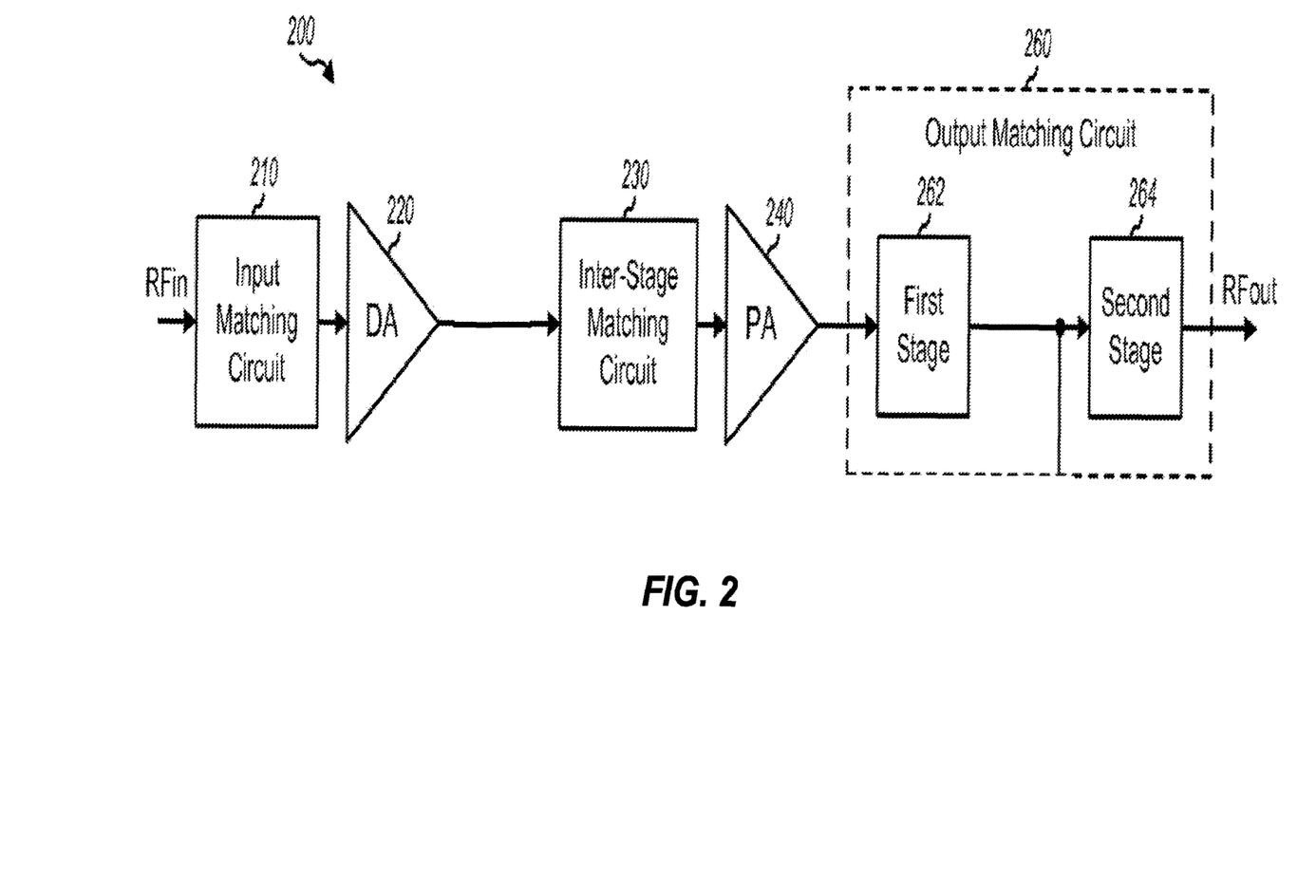
FIG. 2 shows a block diagram of a conventional power amplifier (PA) module or power amplification device.

FIG. 2 shows a block diagram of a conventional power amplifier (PA) module or power amplification device 200. A conventional two-stage power amplifier of the power amplification device 200 includes a driver amplifier (DA) 220 and power amplifier core or power amplifier 240. The driver amplifier may be an open drain driver amplifier. The power amplification device 200 may be used for the driver amplifier 142 and the power amplifier 144 in FIG. 1. Within the power amplification device 200, an input matching circuit 210 receives an input radio frequency signal (RFin) and has its output coupled to the input of the driver amplifier (DA) 220. The DA 220 is coupled to an inter-stage matching circuit 230. A power amplifier 240 has its input coupled to the output of the inter-stage matching circuit 230 and its output coupled to the input of an output matching circuit 260. The output matching circuit 260 includes a first stage 262, and a second stage 264 coupled in series. The first stage 262 is coupled to the input of the second stage 264. The output matching circuit 260 provides an output RF signal (RFout).

Figure 3:
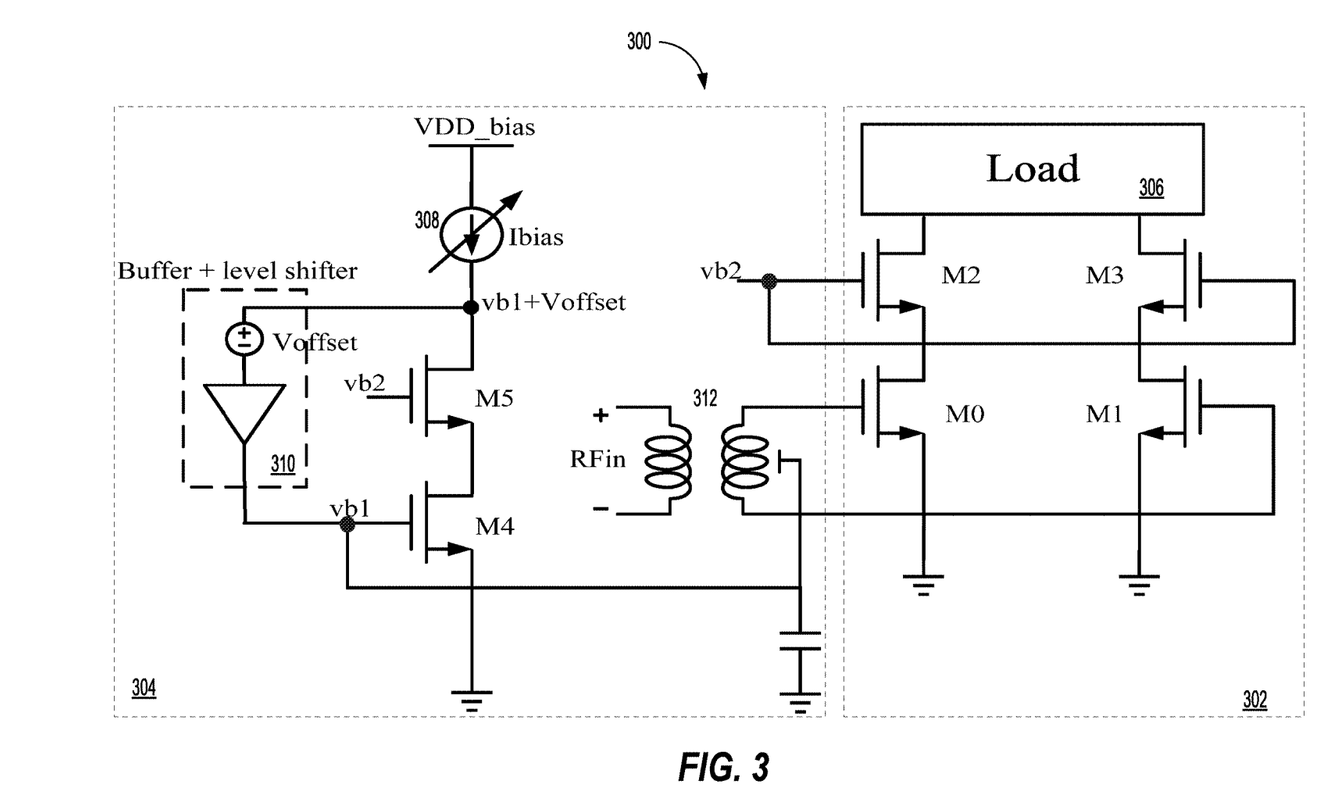
FIG. 3 shows a block diagram of a power amplifier (PA) module or power amplification device including a power amplifier core stage and a bias circuit stage.

FIG. 3 shows a block diagram of a power amplifier (PA) module or power amplification device 300. The power amplification device 300 may be included in a wireless device (e.g., a user equipment). The power amplification device 300 includes a power amplifier core stage 302 that is biased by a bias circuit stage 304. The power amplifier core stage 302 may be based on a differential amplifier configuration that includes transistors M0, M1, M2 and M3. The power amplifier core stage 302 generates drive signals to drive a load 306 coupled to one or more outputs of the power amplifier core stage 302. Exemplary loads coupled to the power amplifier core stage 302 include, but are not limited to, a transformer, an inductor or a matching network. The transistors M0, M1, M2 and M3 are arranged in accordance with a differential configuration. For example, the differential configuration includes a pairing of the transistors M2 and M0 to provide a first output to the load 306 and a second pairing of the transistors M3 and M1 to provide a second output to the load 306. The transistor M2 is identical to the transistor M3 and the transistor M0 is identical to the transistor M1.

The bias circuit stage 304 includes transistors M4 and M5. The transistors M4 and M5 are replicas of the transistors in the first pairing or the second pairing in accordance with a desirable replication ratio. For example, the transistor M4 is a replica of the transistors M0 and M1 and the transistor M5 is a replica of the transistors M2 and M3. A bias current ($I_{PAbias}$) for the power amplifier core stage 302 may be based on a bias current, Ibias, provided by a current source 308 (e.g., an adjustable current source). The current source 308 is driven by a voltage supply VDD_bias. The bias current, Ibias, provided by the current source 308 or driver, may be independently adjusted to adjust the bias current ($I_{PAbias}$) for the power amplifier core stage 302. For example, the bias current for the power amplifier core stage 302 is given by the following equation:

$$I_{PAbias} = \text{Ibias} \times (M0 + M1)/M4$$

A buffer stage 310 with high input impedance serves as a direct current (DC) level shifter. The term direct current (DC) may indicate operation at low frequencies, such as 0 hertz. The level shifter translates only the DC (0 Hz) portion of the signal while all AC (signals>0 Hz) remain the same. The level shifter compensates for a DC voltage difference between a drain of the transistor M5 and a gate of the transistor M4. The DC voltage difference is a consequence of the operating condition to adequately replicate the power amplifier operation.

The bias circuit includes a bias loop that includes the buffer stage 310, the transistors M4 and M5 and forces all of the bias current, Ibias, provided by a current source 308 to flow through the transistor M4. A bias voltage, vb1, at a gate of the transistor M4 is used to bias the power amplifier core stage 302. For example, the bias voltage, vb1, is provided to a gain setting device of the power amplifier core through the bias loop (or feedback bias loop). The bias voltage, vb1, is an amplitude dependent bias voltage. Vb2 is a DC voltage used to bias a gate of each of the transistors M2 and M3 to provide correct cascode operation. The transistor M5 utilizes this voltage to replicate the biasing conditions of the power amplifier core stage 302. As a result of setting vb2, a drain node voltage of each of the transistors M4, M0, and M1 is defined. Due to short channel MOSFET behavior of the transistors M4, M0, and M1, the voltage vb1 is dependent on a voltage at the drain of each of the transistors M4, M0, and M1. Thus, a programming of the voltage vb2 to a different voltage level warrants a change to the voltage vb1.

The bias voltage, vb1, is generated by the bias circuit stage 304. A drain of the transistor M5 is coupled to the current source 308 and the buffer stage 310. A voltage at the drain of the transistor M5 is given by a sum of an offset voltage Voffset associated with the buffer stage 310 and the bias voltage, vb1. For example, the bias voltage, vb1, is provided to a center tap of a transformer 312. The transformer may receive a differential radio frequency signal and the transformer is biased by the DC voltage from the bias circuit stage 304.

First and second differential signals (of opposite radio frequency signal polarity and based on the bias voltage, vb1) are provided through two differential signal paths to the gates of the transistors M0 and M1 via the transformer 312. The signals provided to the transistors M0 and M1 from the transformer 312 are complementary such that when the transistor M0 is driving the load 306, the transistor M1 is powered down, and vice versa. The transformer receives a radio frequency signal RFin to be amplified by the power amplification device 300.

Biasing the power amplifier core stage 302, in accordance with the implementation in FIG. 3, may not adequately improve efficiency of the power amplification device. One approach to improving efficiency of the power amplifier core stage 302 is through envelope tracking (ET) as shown in FIG. 4.

Figure 4:
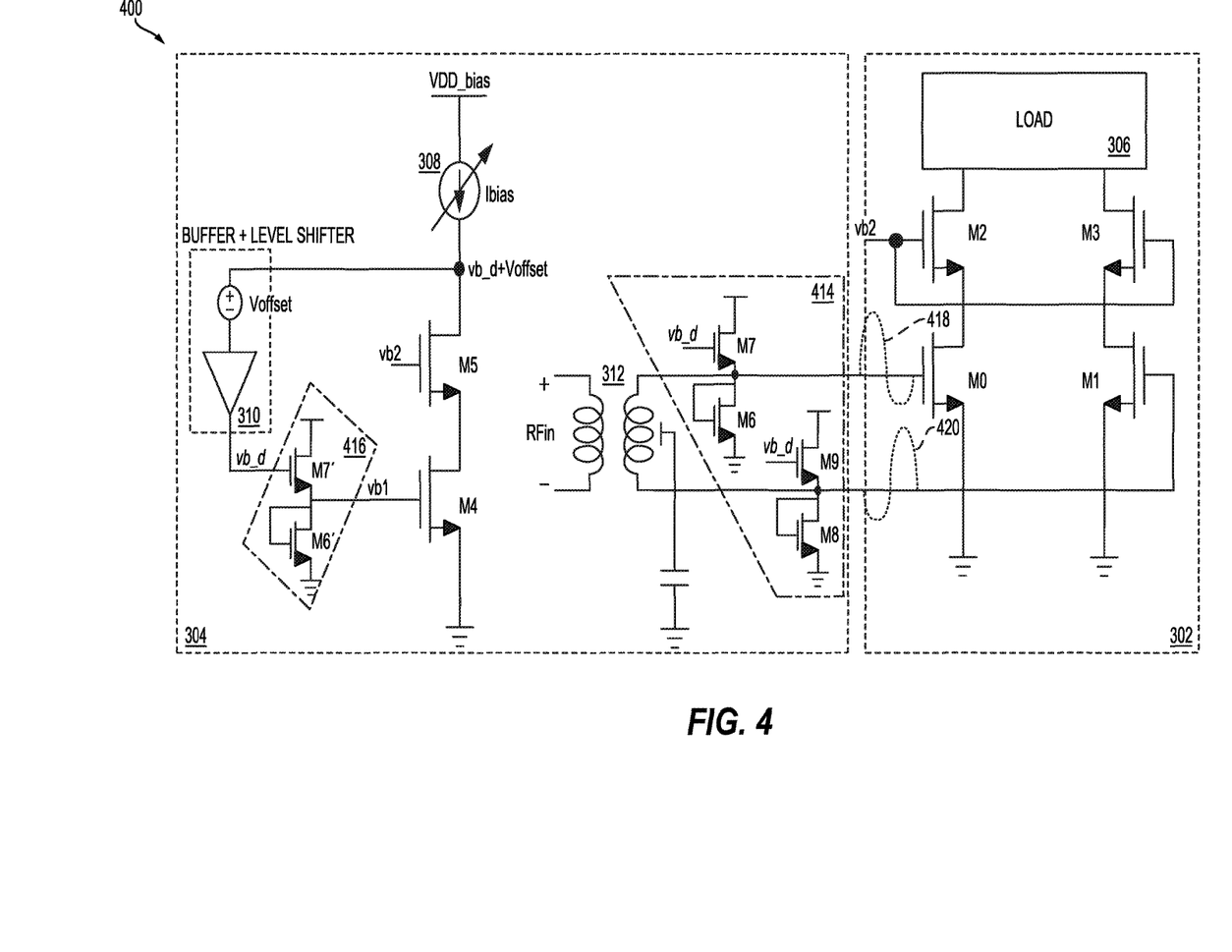
FIG. 4 shows a block diagram of the power amplification device including an envelope tracking stage.

FIG. 4 shows a block diagram of the power amplification device 400 including envelope tracking stages 414 and 416. For illustrative purposes, some of the labelling and numbering of the components and features of FIG. 4 are similar to those of FIG. 3. The difference between the power amplification device 400 and the power amplification device 300 is that the power amplification device 400 includes the envelope tracking stages 414 and 416.

The envelope tracking stage 414 is positioned between the transformer 312 and the power amplifier core stage 302. The envelope tracking stage 414 includes two identical diode based linearizers. The two identical diode based linearizers are added to the differential path from the terminals of the transformer 312 to the gates of the transistors M0 and M1. A first of the two identical diode based linearizers includes transistors M6 and M7 and a second of the two identical diode based linearizers includes transistors M8 and M9. In one implementation, each of the first and the second diode based linearizers respectively generates first and second envelope dependent bias signals 418 and 420 utilizing a second order nonlinearity of the diode based linearizers. The first envelope dependent bias signal 418 and the second envelope dependent bias signal 420 are respectively provided to the gates of the transistors M0 and M1. The signals 418 and 420 provided to the transistors M0 and M1 from the transformer 312 are complementary such that when the transistor M0 is driving the load 306, the transistor M1 is powered down, and vice versa.

The envelope tracking stage 416 is positioned in a signal path between the buffer stage 310 and the gate of the transistor M4. The envelope tracking stage 416 includes a third diode based linearizer. The third diode based linearizer includes transistors M6' and M7'. The envelope tracking stage 416 is a replica (by a desirable ratio) of the envelope tracking stage 414. For example, the transistor M6 is identical to the transistor M6' and the transistor M7 is identical to the transistor M7'. Similarly, the transistor M8 is identical to the transistor M6' and the transistor M9 is identical to the transistor M7'. A DC bias voltage vb_d is generated at a gate of the transistor M7' and provided to bias the transistors M7 and M9. In FIG. 4, the drain of the transistor M5 is coupled to the current source 308 and the buffer stage 310. However, in FIG. 4, a voltage at the drain of the transistor M5 is given by a sum of an offset voltage Voffset associated with the buffer stage 310 and the DC bias voltage vb_d.

When the radio frequency signal traverses the power amplification device 400, due to the nonlinearity of the transistors M6 and M7, the first diode linearizer generates an envelope dependent low frequency voltage component (e.g., first envelope dependent bias signal 418) on top of the DC bias voltage (e.g., vb_d). The first envelope dependent bias signal 418 provides envelope tracking bias to the transistor M0 of the power amplifier core stage 302. Similarly, when the radio frequency signal traverses the power amplification device 400, due to the nonlinearity of the transistors M8 and M9, the second diode linearizer generates an envelope dependent low frequency voltage component (e.g., second envelope dependent bias signal 420) on top of the DC bias voltage (e.g., vb_d). The second envelope dependent bias signal 420 provides envelope tracking bias to the transistor M1 of the power amplifier core stage 302. The first and second envelope dependent bias signals 418 and 420 are provided such that when the first envelope dependent bias signal 418 is ON, the second envelope dependent bias signal 420 is OFF and vice versa.

The power amplification device 400, however, generates unwanted signals and is subject to imbalance that reduces the efficiency of the power amplification device 400. For example, the inefficiencies may be due to the addition of the first and second diode linearizers in the signal output path of the transformer 312 and corresponding introduction of harmonic signals, distortion, and differential imbalance due to layout mismatch of the first and second diode linearizers in the two differential signal paths. To mitigate the deficiencies of the power amplification device 400, aspects of the present disclosure includes a source follower based envelope detector, as illustrated in FIG. 5.

Figure 5:
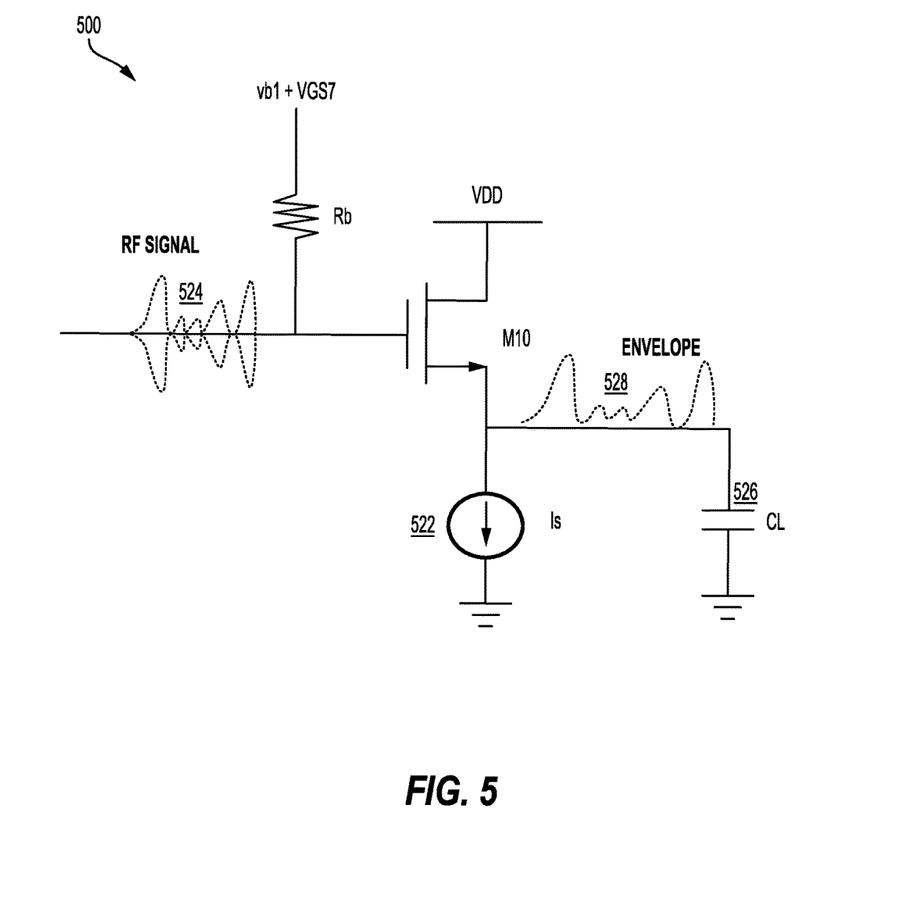
FIG. 5 illustrates an exemplary source follower based envelope detector according to aspects of the present disclosure.

FIG. 5 illustrates an exemplary source follower based envelope detector circuit 500 according to aspects of the present disclosure. The source follower based envelope detector circuit 500 includes a transistor M10 (e.g., source follower transistor), a current source 522 (e.g., constant current source) that generates a current, Is, a resistor Rb, and a capacitor CL coupled to a source of the source follower transistor M10. The source follower transistor M10 is a peak detector with a recovery time constant that tracks the radio frequency envelope signal and represents the radio frequency envelope signal at baseband frequencies (for the most part). The radio frequencies are filtered (e.g., by the filter capacitor CL) as they may have negative attributes at these connections in the circuit.

In one aspect of the disclosure, the resistor Rb is a radio frequency choke that prevents the radio frequency signal from entering the baseband loop. The source follower based envelope detector circuit 500 serves as an envelope detector when a radio frequency signal 524 is sensed at a gate of the transistor, M10. For example, when a swing of the sensed radio frequency signal 524 increases, the bias circuit shows a corresponding increase in non-linearity that causes envelope dependent low frequency voltage to be generated by the source follower transistor M10. In this case, the envelope dependent low frequency voltage is a baseband envelope signal 528 generated at an output (e.g., source) of the source follower transistor M10.

The sensed radio frequency signal 524 may be based on radio frequency signals received at an input of a transformer that is coupled to or included in a bias circuit stage of the power amplification device. The sensed radio frequency signal may be a differential radio frequency signal when the radio frequency signal is received in accordance with a differential configuration. The capacitor, CL, serves as a filter component rejecting the received radio frequency signal 524 at the output of the source follower transistor, M10, while keeping the baseband envelope signal 528. The baseband envelope signal 528 at the output of the source follower transistor, M10, is an envelope dependent low frequency voltage. The source follower based envelope detector circuit 500 may be implemented in a power amplification device to improve efficiency of the power amplification device, as shown in FIG. 6.

Figure 6:
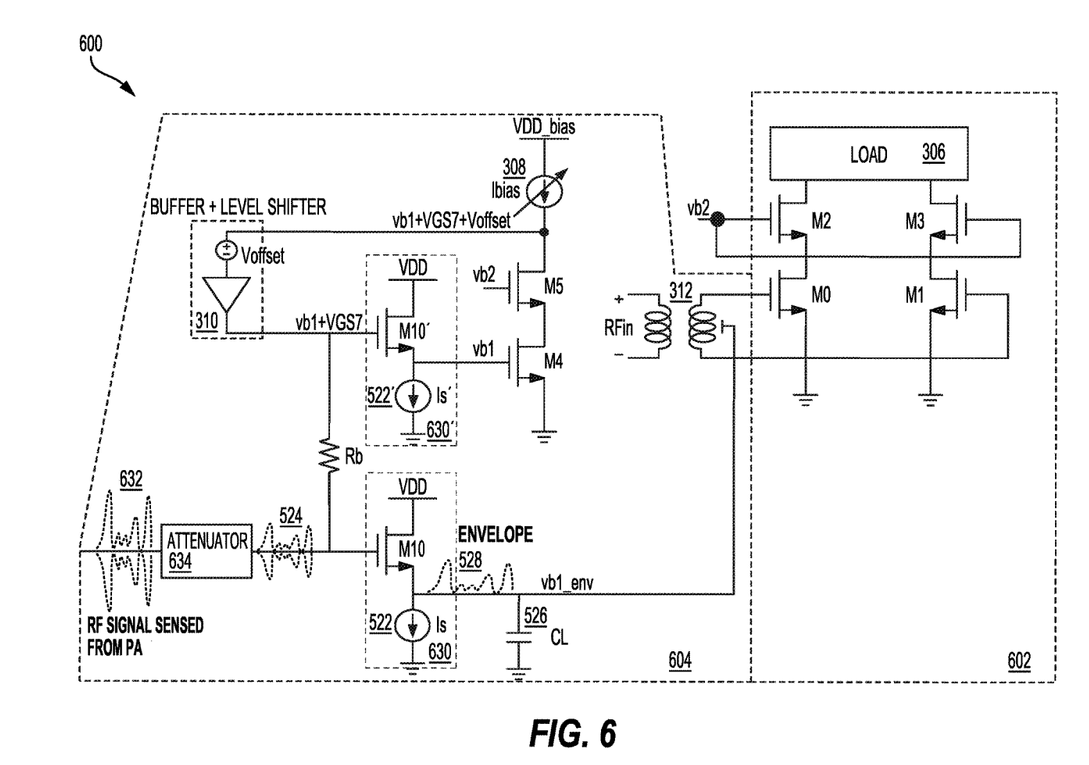
FIG. 6 shows a block diagram of the power amplification device including the source follower based envelope detector stage according to aspects of the present disclosure.

FIG. 6 shows a block diagram of the power amplification device 600 including a source follower based envelope detector stage 604, according to aspects of the present disclosure. For illustrative purposes, some of the labelling and numbering of the components and features of FIG. 6 are similar to those of FIGS. 3 and 5. The power amplification device 600 includes a power amplifier core stage 602 that is biased by the source follower based envelope detector stage 604. The power amplifier core stage 602 is similar to the power amplifier core stage 302 of FIG. 3. The source follower based envelope detector stage 604 of FIG. 6 is similar to the bias circuit stage 304. The difference between the source follower based envelope detector stage 604 and the bias circuit stage 304 is that the source follower based envelope detector stage 604 includes a source follower based envelope detector circuit 630 (e.g., source follower based envelope detector circuit 500) integrated into the bias circuit or bias circuit stage 304 of FIG. 3. A corresponding replica 630' of the source follower based envelope detector circuit 630 is also included in the source follower based envelope detector stage 604.

The corresponding replica 630' includes a transistor M10' and a bias current, Is', driven by a bias voltage VDD. A gate of the transistor M10' is coupled to the buffer stage 310. A bias current for the source follower based envelope detector circuit 630 may be based on the bias current, Is', provided by a current source 522' (e.g., an adjustable current source). The bias current, Is', provided by the current source 522' or driver, may be independently adjusted to adjust the bias current for the source follower based envelope detector circuit 630.

In addition, the power amplification device 600 includes a resistor, Rb, coupled to the source follower based envelope detector circuit 630 and the replica 630'. The power amplification device 600 may also include an adjustable gain device (e.g., attenuator 634) through which a sensed radio frequency signal 632 traverses. The attenuator 634 feeds a gain adjusted version (e.g., scaled version 524) of the radio frequency signal 632 to the power amplification device 600. The attenuator 634 may be coupled to a gate of the source follower transistor, M10. The adjustable gain device scales power of the radio frequency signal 632 without adjusting a waveform of the radio frequency signal 632.

The source follower based envelope detector circuit 630 is positioned in a signal path between the buffer stage 310 and the transformer 312. The source follower based envelope detector circuit 630 generates a desirable envelope detector based bias voltage vb1_env to the power amplifier core stage 302 via the transformer 312. The replica 630' of the source follower based envelope detector circuit 630 is positioned in a signal path between the buffer stage 310 and a gate of the transistor M4. The replica 630' is used to determine the desirable envelope detector based bias voltage, vb1_env, to be provided to the power amplifier core stage 302 via the source follower based envelope detector circuit 630. A resistor, Rb, may be positioned between the gate of a replica, M10' and the gate of the source follower transistor, M10. The radio frequency signal 632 is sensed by the power amplification device 600 and fed to the source follower based envelope detector stage 604.

In one aspect of the disclosure, the sensed radio frequency signal 632 is fed to the source follower based envelope detector stage 604 via the attenuator 634. The attenuator 634 scales the amplitude of the radio frequency signal 632 as desired to obtain the scaled version 524 of the radio frequency signal 632. The source follower transistor, M10, is biased through the resistor, Rb, to the gate of the replica, M10'. The bias voltage is a sum of a DC bias voltage, vb1, generated by the bias loop and a gate to source voltage, VGS7, of the replica, M10'. In one aspect of the disclosure, the bias loop includes the buffer stage 310, source follower based envelope detector circuit 630 and the transistors M4 and M5.

The bias loop operates to generate a specified DC bias voltage for the transistor M10, which in turn maintains bias current in the transistor M4 and correspondingly maintains bias current in the transistors M0 and M1. The bias loop is not associated with the radio frequency portion of the source follower based envelope detector stage 604. For example, the radio frequency signals 524 are sensed and provided to the source follower based envelope detector circuit 630 and/or the attenuator 634 and not the bias loop. Thus, the bias loop may operate in accordance with a low frequency while the source follower based envelope detector circuit 630 and/or the attenuator 634 operate in accordance with a high frequency (e.g., wide band).

A voltage at the drain of the transistor M5, in FIG. 6, is given by a sum of a DC bias voltage vb1, Voffset, and a gate to source voltage, VGS7, of the replica, M10'. When there are no sensed radio frequency signals 524, the envelope detector based bias voltage (or envelope tracking bias signal), vb1_env, maps the DC bias voltage vb_1, because the transistor, M10', is a replica of the source follower transistor, M10. The DC bias voltage, vb1, is a bias signal generated by the bias circuit stage or bias loop. The envelope detector based bias voltage, vb1_env, is radio frequency envelope dependent and thus provides envelope tracking bias when the radio frequency signal is sensed by the source follower based envelope detector stage 604. The envelope detector based bias voltage, vb1_env represents a nominal DC bias for M0 and M1 combined with a proportional amount of a signal representing the radio frequency envelope signal at baseband frequencies.

The level of bias boost may be adjusted by controlling a gain adjustment (e.g., an attenuation) of the gain adjustment device (e.g., attenuator).

Figure 7:
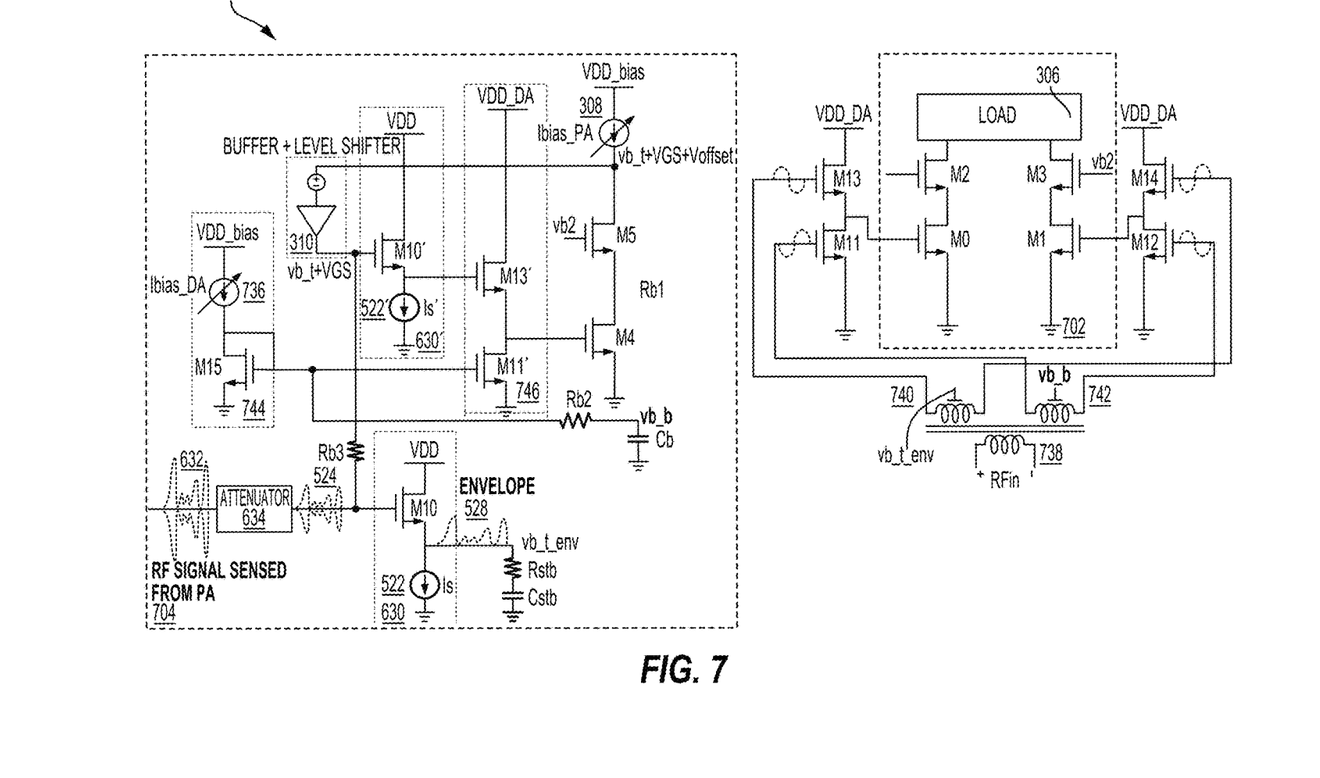
FIG. 7 illustrates another power amplification device including a source follower based envelope detector stage and a power amplifier core stage in a push-pull source follower configuration according to one aspect of the present disclosure.

Aspects of the present disclosure may be implemented to generate bias to a push-pull differential source follower driven power amplifier, as illustrated in FIG. 7.

FIG. 7 illustrates another power amplification device 700 including a source follower based envelope detector stage 704 and a power amplifier core stage 702 in a push-pull source follower configuration, according to one aspect of the present disclosure. For illustrative purposes, some of the labelling and numbering of the components and features of FIG. 7 are similar to those of FIGS. 3, 5 and 6.

The power amplification device 700 excludes conventional components such as the driver amplifier and the power amplifier input matching circuit (e.g., input matching circuit 210), and/or inter-stage matching circuit (e.g., inter-stage matching circuit 230) to reduce the physical space of the power amplification device 700 while maintaining or improving the capability of the power amplification device 700. The excluded conventional components are replaced with a passive voltage gain stage to make up the gain that was provided by the excluded conventional components.

In one aspect of the present disclosure, the passive voltage gain stage includes a transformer coupled to a differential push-pull source follower stage. The differential push-pull source follower stage may include a first set of transistors and a second set of transistors. The first set of transistors includes a pairing of a first source follower input transistor M13 and a first current source transistor M11. The second set of transistors includes a pairing of a second source follower input transistor M14 and a second current source transistor M12. The transformer includes a primary winding stage 738 coupled to the external source to receive differential radio frequency signals, RFin. The transformer also includes two secondary winding stages (first and second secondary winding stages 740 and 742) coupled to the transistors M11, M12, M13 and M14. In some aspects the disclosure, at least a portion of the passive voltage gain stage may be included in the power amplifier core stage 702 or separate but coupled to the power amplifier core stage 702. In other aspects, at least a portion of the passive voltage gain stage may be included in the source follower based envelope detector stage 704 or separate but coupled to the source follower based envelope detector stage 704.

The source follower based envelope detector stage 704 of FIG. 7 is similar to the source follower based envelope detector stage 604 of FIG. 6. The difference between the two stages is that the source follower based envelope detector stage 704 includes a radio frequency signal amplitude bias circuit 744 and a push-pull replica circuit 746 integrated into the source follower based envelope detector stage 604 of FIG. 6. The push-pull replica circuit 746 is a replica of the differential push-pull source follower stage. For example, the transistor M13' is identical to the transistors M13 and M14 while the transistor M11' is identical to the transistors M11 and M12.

In this aspect, the sensed radio frequency signal 632 is fed to the source follower based envelope detector stage 704 via the gain adjustment device (e.g., attenuator 634.) The attenuator 634 scales the power of the radio frequency signal 632 as desired to obtain the scaled version 524 of the radio frequency signal 632. The source follower transistor, M10, is biased by a DC bias voltage through the resistor, Rb3, to the gate of the replica, M10'. The bias voltage is a sum of a DC bias voltage vb_t and a gate to source voltage, VGS, of the replica, M10'. The DC bias voltage vb_t is generated by a bias loop including the buffer stage 310, the source follower based envelope detector circuit 630, the push-pull replica circuit 746 and the transistors M4 and M5.

The bias loop operates as a current mirror to track process and temperature variations of the power amplifier core stage 602 and/or the differential push-pull source follower stage and to map the power amplifier core stage 602 and the differential push-pull source follower stage. The bias loop is not associated with the radio frequency portion of the source follower based envelope detector stage 704. For example, the radio frequency signals 632 are sensed and provided to the source follower based envelope detector circuit 630 and/or the attenuator 634 and not the bias loop.

The source follower based envelope detector circuit 630 generates a desirable envelope detector based bias voltage vb_t_env based on the sensed radio frequency signal 632. The capacitor, Cstb, and the resistor, Rstb, serve as a filter component to reject the received radio frequency signal 524 at the output of the source follower transistor, M10, while keeping the baseband envelope signal 528. The resulting baseband envelope signal 528 at the output of the source follower transistor, M10, is an envelope dependent low frequency voltage.

The source follower based envelope detector circuit 630 provides the envelope detector based bias voltage vb_t_env to the power amplifier core stage 702 via the transformer and the differential push-pull source follower stage. The envelope detector based bias voltage vb_t_env has an amplitude increase relative to the sensed radio frequency signal, RFin. For example, the amplitude is increased by changing an instantaneous gain of the power amplifier core stage 702. The envelope detector based bias voltage vb_t_env may be provided to a center tap of the first secondary winding stage 740 and subsequently to a gate of the first source follower input transistor M13. An output of the first source follower input transistor M13 is coupled to a gate of the transistor M0. The envelope detector based bias voltage vb_t_env is also provided to a gate of the second source follower input transistor M14 via the center tap of the first secondary winding stage 740. An output of the second source follower input transistor M14 is coupled to a gate of the transistor M1.

The radio frequency signal amplitude bias circuit 744 includes a transistor M15 and a bias current, Ibias_DA driven by a bias voltage VDD bias. A gate of the transistor M15 is coupled to a gate of the transistor M11'. A bias current for the differential push-pull source follower stage may be based on the bias current, Ibias_DA, provided by a current source 736 (e.g., an adjustable current source). The bias current, Ibias_DA, provided by the current source 736 or driver may be independently adjusted to adjust the bias current for the differential push-pull source follower stage. The differential push-pull source follower stage (e.g., transistors M11 and M12) is biased through the resistor, Rb2, to the center tap of the second secondary winding stage 742. The resulting bias voltage vb_b prevents contamination of sensitive nodes of the bias loop. Accordingly, the resulting bias voltage vb_b is specified to be as close to the DC voltage as possible.

The capacitor, Cb, serves as a filter component to reject or filter off stray radio frequency signals and radio frequency signals (e.g., harmonics of the baseband envelope signal) that are above the baseband envelope signal 528. The filtering prevents unwanted signals from entering sensitive nodes of the bias loop to cause undesired results. The resulting signal vb_b is not associated with the radio frequency portion of the source follower based envelope detector stage 704. For example, the radio frequency signals 632 are sensed and provided to the source follower based envelope detector circuit 630 and/or the attenuator 634 and not the radio frequency signal amplitude bias circuit 744. The bias voltage vb_b is flat or does not increase relative to the sensed radio frequency signal.

The bias voltage vb_b is provided to the center tap of the second secondary winding stage 742 and subsequently to gates of the transistors M11 and M12. The outputs of the transistors M11 and M12 are respectively coupled to the gates of the transistors M0 and M1.

The present disclosure provides the same DC bias condition as a conventional bias topology while boosting an amplitude of the bias voltage according to a radio M10 signal strength. Aspects of the disclosure reduces imbalance in the circuit by eliminating additional devices in the signal output path of the transformer or load signal path, thereby reducing unwanted distortion, complexity and imbalance to the power amplification device.

Figure 8:
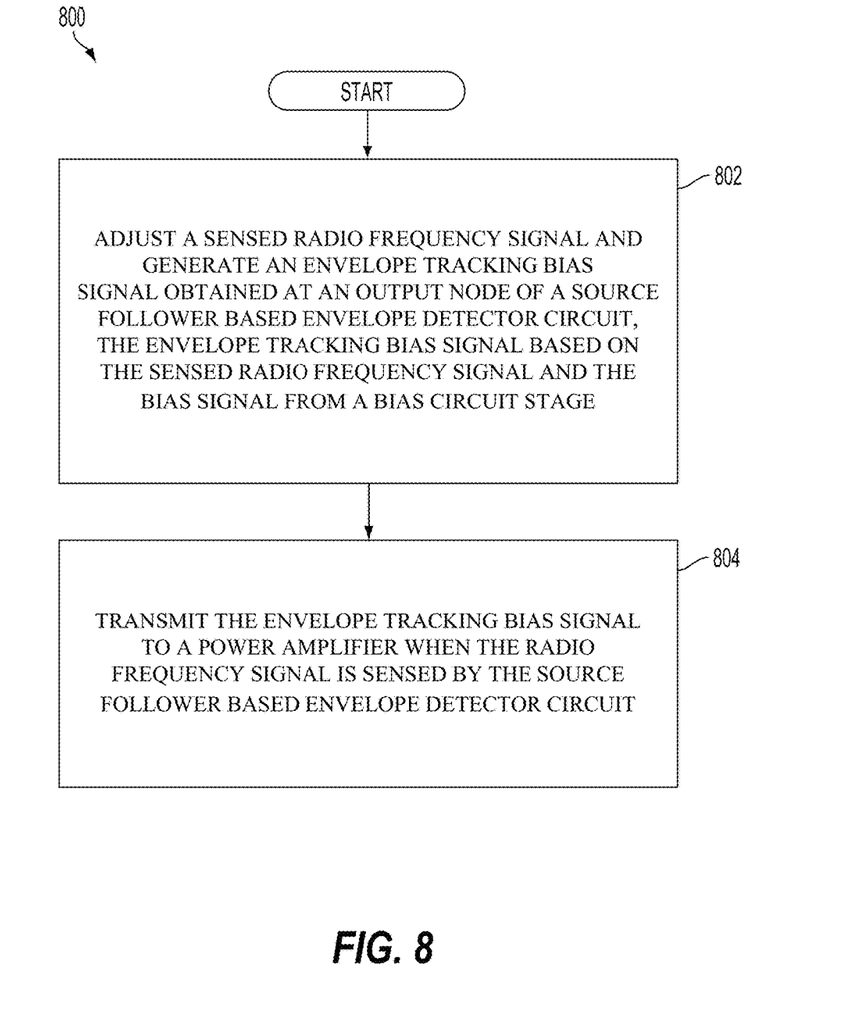
FIG. 8 is a process flow diagram illustrating a signal amplification method according to aspects of the present disclosure.

FIG. 8 is a process flow diagram 800 illustrating a method of performing signal amplification according to an aspect of the present disclosure. In block 802, a gain adjustment device adjusts a gain of (or attenuates) a sensed radio frequency signal and generates an envelope tracking bias signal obtained at an output node of a source follower based envelope detector circuit. The envelope tracking bias signal is based on the gain adjusted radio frequency signal and a bias signal from a bias circuit stage or power amplifier bias circuit stage. In block 804, the source follower based envelope detector circuit transmits the envelope tracking bias signal to a power amplifier when the radio frequency signal is sensed by the source follower envelope detector circuit.

According to a further aspect of the present disclosure, a power amplification device is described. The power amplification device includes means for generating current to an output node of the first source follower transistor. The current generating means may be the current source 308, the current source 522, and/or the current source 736. The power amplification device also includes means for filtering radio frequency signals at the output node of the first source follower transistor. The filtering means may be the capacitor, Cstb, and the resistor, Rstb, the capacitor Cb, and/or the capacitor CL. In another aspect, the aforementioned means may be any module or any apparatus configured to perform the functions recited by the aforementioned means.

Figure 9:
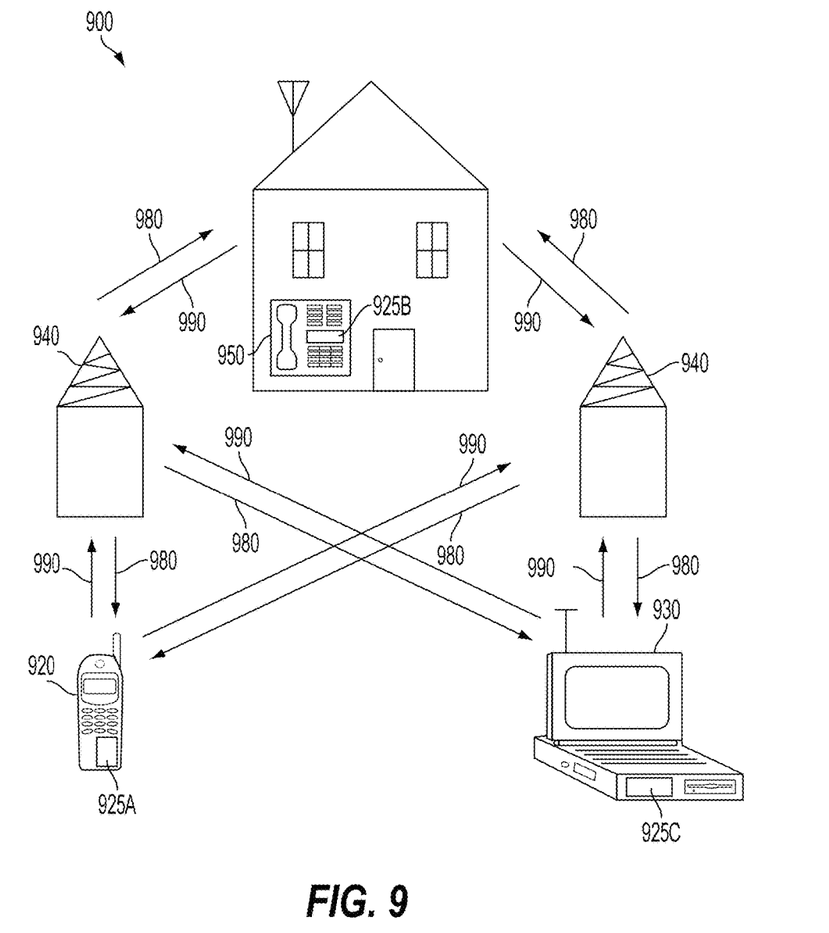
FIG. 9 is a block diagram showing an exemplary wireless communication system in which a configuration of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed power amplification device. It will be recognized that other devices may also include the disclosed power amplification device, such as the base stations, switching devices, and network equipment. FIG. 9 shows forward link signals 980 from the base station 940 to the remote units 920, 930, and 950 and reverse link signals 990 from the remote units 920, 930, and 950 to base station 940.

In FIG. 9, remote unit 920 is shown as a mobile telephone, remote unit 930 is shown as a portable computer, and remote unit 950 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed power amplification device.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A power amplifier bias circuit with embedded envelope detection comprising:
   an envelope detector circuit configured to generate a baseband envelope tracking bias signal to bias a power amplifier, the envelope detector circuit including:
      a first source/emitter follower transistor,
      a first current driver coupled to an output node of the first source/emitter follower transistor, and
      a filter coupled to the output node of the first source/emitter follower transistor; and
   a power amplifier bias circuit stage coupled to the envelope detector circuit, the power amplifier bias circuit stage including:
      at least one replica transistor of the power amplifier,
      an envelope detector replica transistor, and
      a replica of the first current driver of the envelope detector circuit.

2. The power amplifier bias circuit of claim 1, further comprising a bias signal generated by the power amplifier bias circuit stage and provided at a gate/base of the first source/emitter follower transistor and a gate/base of the envelope detector replica transistor.

3. The power amplifier bias circuit of claim 2, further comprising a radio frequency signal sensed and provided to the gate/base of the first source/emitter follower transistor, the radio frequency signal that is sensed being the same as the radio frequency signal that is received by the power amplifier.

4. The power amplifier bias circuit of claim 3, in which the filter of the envelope detector circuit is configured to reject the radio frequency signal at the output node of the first source/emitter follower transistor.

5. The power amplifier bias circuit of claim 3, in which the baseband envelope tracking bias signal is obtained at the output node of the first source/emitter follower transistor, the baseband envelope tracking bias signal to be provided to the power amplifier when the radio frequency signal is sensed at the envelope detector circuit.

6. The power amplifier bias circuit of claim 3, in which the power amplifier comprises a differential power amplifier, and in which a transformer is coupled between the power amplifier bias circuit stage and the power amplifier via a differential signal path.

7. The power amplifier bias circuit of claim 6, in which the baseband envelope tracking bias signal is provided to a center tap of the transformer.

8. The power amplifier bias circuit of claim 3, further comprising an adjustable gain device coupled to the envelope detector circuit, in which the radio frequency signal is provided to the envelope detector circuit via the adjustable gain device.

9. The power amplifier bias circuit of claim 3, further comprising a resistor coupled between the envelope detector circuit and the power amplifier bias circuit stage, in which the gate/base of the first source/emitter follower transistor is biased through the resistor.

10. The power amplifier bias circuit of claim 1, in which the power amplifier comprises a push-pull differential source/emitter follower driven power amplifier, and in which the at least one replica transistor of the power amplifier comprises a plurality of replica transistors that replicate transistors of the push-pull differential source/emitter follower driven power amplifier.

11. The power amplifier bias circuit of claim 1, further comprising a second current driver coupled to the at least one replica transistor of the power amplifier, the first current driver and the second current driver being independently adjustable to respectively adjust current through the envelope detector circuit and current through the at least one transistor of the power amplifier.

12. A power amplifier bias circuit with embedded envelope detection comprising:
   an envelope detector circuit configured to generate a baseband envelope tracking bias signal to bias a power amplifier, the envelope detector circuit including:
      a first source/emitter follower transistor,
      means for generating current to an output node of the first source/emitter follower transistor, and
      means for filtering radio frequency signals at the output node of the first source/emitter follower transistor; and
   a power amplifier bias circuit stage coupled to the envelope detector circuit, the power amplifier bias circuit stage including:
      at least one replica transistor of the power amplifier,
      an envelope detector replica transistor, and
      a replica of the current generating means of the envelope detector circuit.

13. The power amplifier bias circuit of claim 12, further comprising a bias signal generated by the power amplifier bias circuit stage and provided at a gate/base of the first source/emitter follower transistor and a gate/base of the envelope detector replica transistor.

14. The power amplifier bias circuit of claim 13, further comprising a radio frequency signal sensed and provided to the gate/base of the first source/emitter follower transistor, the radio frequency signal that is sensed being the same as the radio frequency signal that is received by the power amplifier.

15. The power amplifier bias circuit of claim 14, in which the filtering means rejects the radio frequency signal at the output node of the first source/emitter follower transistor.

16. The power amplifier bias circuit of claim 14, in which the baseband envelope tracking bias signal is obtained at the output node of the first source/emitter follower transistor, the baseband envelope tracking bias signal to be provided to the power amplifier when the radio frequency signal is sensed at the envelope detector circuit.

17. The power amplifier bias circuit of claim 14, in which the power amplifier comprises a differential power amplifier, and in which a transformer is coupled between the power amplifier bias circuit stage and the power amplifier via a differential signal path.

18. The power amplifier bias circuit of claim 17, in which the baseband envelope tracking bias signal is provided to a center tap of the transformer.

19. The power amplifier bias circuit of claim 12, further comprising a current driver coupled to the at least one replica transistor of the power amplifier, the current generating means and the current driver being independently adjustable to respectively adjust current through the envelope detector circuit and current through the at least one transistor of the power amplifier.

20. A method of biasing a power amplifier core stage of a power amplification device, comprising:
   adjusting a gain of a sensed radio frequency signal;
   generating an envelope tracking bias signal obtained at an output node of a source/emitter follower based envelope detector circuit, the envelope tracking bias signal based at least in part on the sensed radio frequency signal with the adjusted gain and a bias signal from a power amplifier bias circuit stage;

transmitting the envelope tracking bias signal to a power amplifier when the sensed radio frequency signal is applied to the source/emitter follower based envelope detector circuit; and transmitting the envelope tracking bias signal to a center tap of a transformer coupled between the source/emitter follower based envelope detector circuit and the power amplifier.

21. The method of biasing the power amplifier core stage of claim 20, further comprising filtering at the output node of the source/emitter follower based envelope detector circuit to obtain the envelope tracking bias signal and to reject the sensed radio frequency signal.

\* \* \* \* \*